United States Patent [19]
Takahashi

[11] Patent Number: 5,376,881
[45] Date of Patent: Dec. 27, 1994

[54] METHOD AND APPARATUS FOR TESTING SELF-COMMUTATIVE ELECTRIC POWER CONVERSION DEVICE

[75] Inventor: Kazutoshi Takahashi, Saitamaken, Japan

[73] Assignee: Kabushiki Kaisha Toshiba, Tokyo, Japan

[21] Appl. No.: 950,126

[22] Filed: Sep. 24, 1992

[30] Foreign Application Priority Data

Sep. 25, 1991 [JP] Japan .................. 3-245893

[51] Int. Cl.$^5$ ............................................. G01R 31/02
[52] U.S. Cl. ..................... 324/158.1; 324/511
[58] Field of Search ............... 324/158 R, 73.1, 427, 324/511, 537, 158 D

[56] References Cited

U.S. PATENT DOCUMENTS 5,170,118 12/1992 Schumacher .............. 324/158 R
5,182,518 1/1993 Stich et al. ................. 324/511

OTHER PUBLICATIONS

ETZ Elektrotechnische Zeitschrift, vol. 108, No. 21, pp. 1032 and 1034–1035, Nov. 1987, H. Van Der Broeck, "Testschaltung Fur Spannungspragende Pulswechselrichter Hoher Leistung".
Proceedings of the 26th Intersocieity Energy Conversion Engineering Conference, vol. 2, pp. 381–386, Aug. 4–9, 1991, R. C. Lebron, et al., "Test and Evaluation of Load Converter Topologies Used in the Space Station Freedom Power Management and Distribution DC Test Bed".

Primary Examiner—Ernest F. Karlsen
Attorney, Agent, or Firm—Oblon, Spivak, McClelland, Maier & Neustadt

[57] ABSTRACT

A method and an apparatus for testing a self-commutative electric power conversion device, capable of verifying the maximum voltage stress and the maximum current stress in the main circuit of the device by using a testing facility equipped with the power source and the load having relatively small capacities. The pulse shaped turn on and turn off signals are supplied to the switching elements in the self-commutative electric power conversion device, such that a load current having a desired current level for testing flows though an inductive load connected to an AC output side of the self-commutative electric power conversion device having the DC capacitor charged to a desired voltage level for testing. Then, voltage and current waveforms in the self-commutative electric power conversion device are measured, while the pulse shaped turn on and turn off signals are supplied to the switching elements, to verify an operation of the self-commutative electric power conversion device under voltage stress and current stress.

9 Claims, 2 Drawing Sheets

METHOD AND APPARATUS FOR TESTING SELF-COMMUTATIVE ELECTRIC POWER CONVERSION DEVICE

BACKGROUND OF THE INVENTION

1. Field of the Invention

The present invention relates to a testing of a self-commutative electric power conversion device for converting DC electric power to AC electric power, and more particularly, to a method and an apparatus for the verifying of a the voltage stress and a current stress in the self-commutative electric power conversion device.

2. Description of the Background Art

In a conventional method of testing the voltage stress and the current stress in a main circuit of a self-commutative electric power conversion device, a load equivalent to the rated load of the device is connected on its AC output side, while a power source having a capacity to supply a sufficient output voltage on the load is provided on its DC input side, and then the load test is carried out by operating a control circuit of the self-commutative electric power conversion device or an equivalent testing circuit.

Now, in such a conventional testing method, the voltage stress and the current stress of the main circuit can be verified only for the voltages below the rated voltage and the currents below the overloading rated current. However, the protection levels for the excessive voltage and the excessive current in the device are usually set at values higher than the rated voltage and the rated current of the device. As a consequence, it has been impossible in a conventional testing method to verify whether the voltage stress and the current stress exerted on the device are below the tolerable levels In a case the protection against the excessive voltage is activated or a case the cut off of the excessive current is made.

On the other hand, in recent years, the self-commutative electric power conversion device with a very large capacity has been demanded by such a practical application as the power source for a large size linear motor car, the large scale frequency conversion, and the large scale reactive power compensation, so that the capacities of the power source and tile load required in testing such a very large capacity self-commutative electric power conversion device by the above described conventional testing method also become very large, and consequently the testing of such a very large capacity self-commutative electric power conversion device in the factory requires tile enormous cost and space for the testing facility.

Furthermore, the self-commutative electric power conversion device generally uses PWM (Pulse Width Modulation) controlling. However, a very large capacity is usually realized in the self-commutative electric power conversion device by connecting a large number or circuit elements in series, and when such a very large capacity self-commutative electric power conversion device is operated under the PWM controlling, it is very difficult to measure the maximum voltage stress and the maximum current stress in the main circuit of the device by using a usual measurement equipment, because it is difficult to make the simultaneous measurements of the voltage and the current in such a very large capacity self-commutative electric power conversion device due to the presence of a series connection of a large number of circuit elements, and consequently it is difficult to identify the proper timing for the occurrence of the maximum voltage stress and the maximum current stress.

SUMMARY OF THE INVENTION

It is therefore an object of the present invention to provide a method and an apparatus for testing a self-commutative electric power conversion device, capable of verifying the maximum voltage stress and the maximum current stress in the main circuit of the device by using a testing facility equipped with the power source and the load having relatively small capacities.

According to one aspect of the present invention there is provided a method of testing a self-commutative electric power conversion device including a DC capacitor and switching elements, comprising the steps of: supplying pulse shaped turn on and turn off signals to the switching elements in the self-commutative electric power conversion device, such that a load current having a desired current level for testing flows though an inductive load connected to an AC output side of the self-commutative electric power conversion device having the DC capacitor charged to a desired voltage level for testing; and measuring voltage and current waveforms in the self-commutative electric power conversion device, while the pulse shaped turn on and turn off signals are supplied to the switching elements by the supplying step, to verify an operation of tile self-commutative electric power conversion device under voltage stress and current stress.

According to another aspect of tile present invention there is provided an apparatus for testing a self-commutative electric power conversion device including a DC capacitor and switching elements, comprising: pulse signal generator means for supplying pulse shaped turn on and turn off signals to the switching elements in the self-commutative electric power conversion device, such that a load current having a desired current level for testing flows though an inductive load connected to an AC output side of the self-commutative electric power conversion device having the DC capacitor charged to a desired voltage level for testing; and measurement means for measuring voltage and current waveforms in the self-commutative electric power conversion device, while the pulse shaped turn on and turn off signals are supplied to the switching elements by the pulse signal generator means, to verify an operation of the self-commutative electric power conversion device under voltage stress and current stress.

Other features and advantages of the present invention will become apparent from the following description taken in conjunction with the accompanying drawings.

DETAILED DESCRIPTION OF THE PREFERRED EMBODIMENTS

Figure 1:
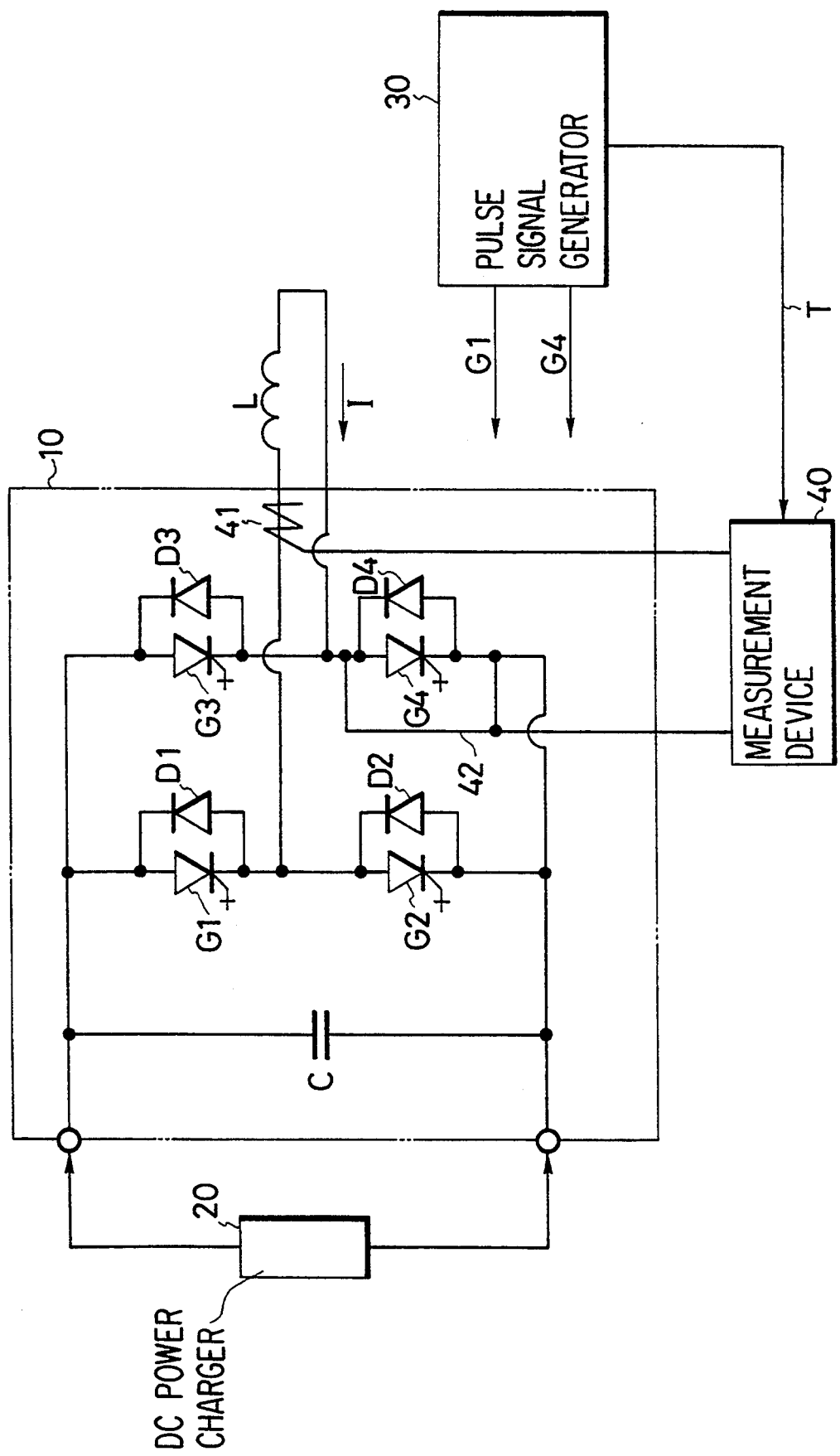
FIG. 1 is a block diagram of one embodiment of an apparatus for testing a self-commutative electric power conversion device according to the present invention.

Referring now to FIG. 1, one embodiment of an apparatus for testing a self-commutative electric power conversion device according to the present invention will be described in detail.

In the following, a case of testing a self-commutative inverter 10 for a single phase bridge connection, which is formed by a DC capacitor C, GTOs (Gate Turn-Off thyrister) G1 to G4, and feedback diodes D1 to D4 as shown in FIG. 1, will be described as an example.

As shown in FIG. 1, In this embodiment, the testing apparatus comprises: an inductive load reactor L connected on an AC output side of the self-commutative inverter 10 for loading the self-commutative inverter 10; a DC power charger 20 for charging the DC capacitor C of the self-commutative inverter 10 to a required voltage level; a pulse signal generator 30, to be connected to appropriate switching elements in the self-commutative inverter 10 according to the voltage and the current to be measured in the test, for supplying pulse signals to determine the waveform of the current flowing through the load reactor L; and a measurement device 40 equipped with a current detector 41 and a voltage detector 42 for measuring the current and the voltage in the self-commutative inverter 10, which is to be controlled by a trigger signal T supplied from the pulse signal generator 30 for indicating the proper timing for the measurement of the voltage and current waveforms in the self-commutative inverter 10.

Here, the load reactor L may be replaced by a built-in reactor (not shown) connected to the AC output side of the self-commutative inverter 10 when the self-commutative inverter 10 is equipped with such a built-in reactor.

Also, the DC power charger 20 may be replaced by a rectifier (not shown) for supplying a DC power to the self-commutative inverter 10, or a built-in pre-charger circuit (not shown) of the self-commutative inverter 10 when the self-commutative inverter 10 is equipped with such a built-in pre-charger circuit.

The pulse signal generator 30 can be constructed by using two commercially available oscillators, which are to be operated in synchronization to realize the generation of the appropriate pulse signals as will be described below.

Now, the testing of the self-commutative inverter 10 is carried out by operating this testing apparatus of FIG. 1 as follows.

First, the DC capacitor C of the self-commutative inverter 10 is charged by the DC power charger 20, up to a required testing voltage level such as 7300 V for example. After this charging of the DC capacitor C of the self-commutative inverter 10 is completed, the DC power charger 20 can be disconnected from the self-commutative inverter 10, or left to be connected as shown in FIG. 1.

Figure 2:
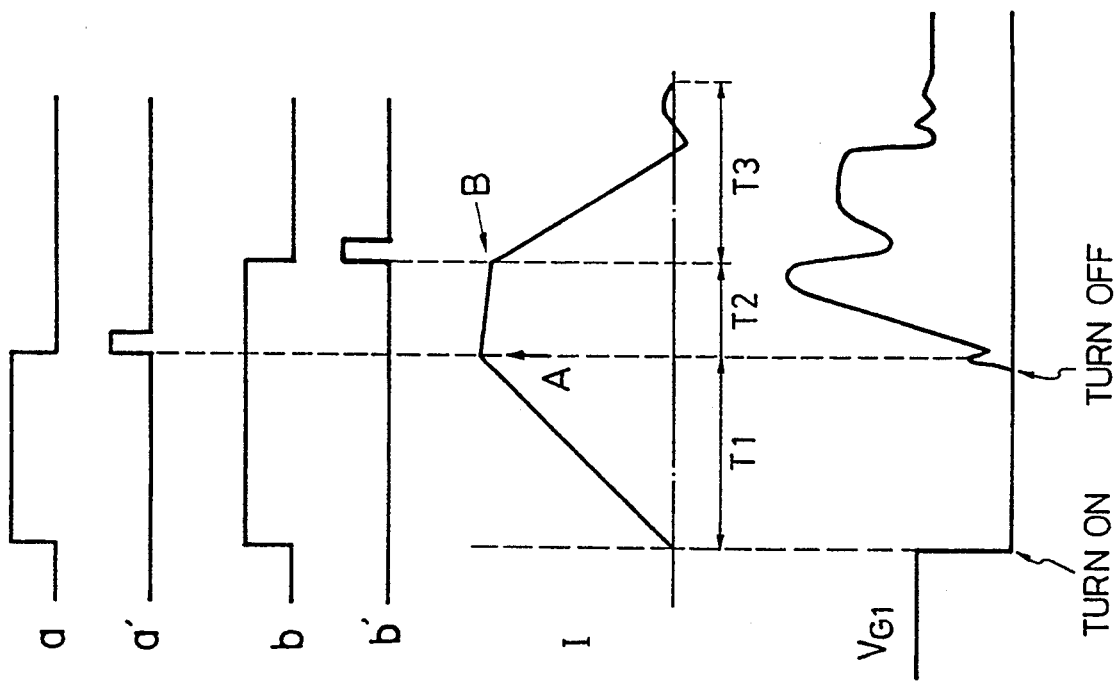
FIG. 2 is a timing chart for explaining a testing method according to the present invention, to be realized by the operation of the apparatus of FIG. 1.

Then, the pulse signal generator 30 is connected to the GTO G1 and the GTO G4 of the self-commutative inverter 10 first, and a G1 turn on pulse signal (a) and a G4 turn on pulse signal (b) shown in FIG. 2 are supplied to the GTOs G1 and G4, respectively.

Here, when the load reactor L has the inductance equal to 3.7 mH for example, in response to the pulse signals (a) and (b) supplied from the pulse signal generator 30 to the GTOs G1 and G4, a load current I shown in FIG. 2 flows from the DC capacitor C, through the GTOs G1 and G4, into the load reactor L, for a first period T1 which is set to be 1.5 ms for example. This load current I increases at a rate equal to the voltage changed by the DC power charger 20 divided by the inductance of the load reactor L.

Then, at a timing (A) at the end of the first period T1, when the load current I reaches to the required testing current level such as 2000 A which is set above the protection level for the excessive current as well as the rated current of the self-commutative inverter 10, the pulse signal generator 30 supplies a G1 turn off pulse signal (a'), as shown In FIG. 2, the GTO G1.

In response, the current flowing through the GTO G1 is cut off, so that the load current I flows through the GTO G4 and the feedback diode D2 associated with the GTO G2, for a second period T2 which is set to be 0.1 ms for example.

Then, at a timing (B) at the end of the second period T2, the pulse signal generator 30 supplies a G4 turn off pulse signal (b'), as shown in FIG. 2, to the GTO G4.

In response, the current flowing through the GTO G4 is also cut off, so that the load current I flows through the feedback diodes D2 and D3 associated with tile GTOs G2 and G3 and returns to the DC capacitor C, during a third period T3 which is set to be 1.4 ms for example.

During these first, second and third periods T1, T2, and T3 described above, the waveform of the voltage on the GTO G1 changes as $V_{G1}$ shown In FIG. 2.

In this manner, the testing is carried out by staring from the low settings of the voltage and the current used for the testing first, and then gradually increasing the settings of the voltage and the current, until the operation of the self-commutative inverter 10 is verified for the maximum voltage and the maximum current obtainable within the cooperative device protection limit of the self-commutative inverter 10.

In this testing procedure, the important timings for making the measurement of the voltage and the current are the turn on timing and the turn off timing of the GTOs G1 and G4, so that the measurement device 40 is controlled to make the measurement of the voltage and current waveforms by the trigger signal T from the pulse signal generator 30 indicating these turn on and turn off timings of the GTOs G1 and G4.

After the above described testing procedure is completed with respect to the GTOs G1 and G4, the same testing procedure is carried out with respect to the other GTOs G2 and G3, by connecting the pulse signal generator 30 to the GTOs G2 and G3 instead of the GTOs G1 and G4 in the procedure described above.

By operating the testing apparatus of FIG. 1 according to the testing procedure described above, it becomes possible to verify the proper operation of the self-commutative inverter 10 under the maximum voltage stress and the maximum current stress.

It is to be noted that, in tile timing chart of FIG. 2, the turn off timing of the GTO G1 occurs before the turn off timing of the GTO G4, but this order of the turn off timings of the GTOs is not essentially important in the testing procedure of the present invention, and an equivalent test result can also be obtained by setting the turn off timing of the GTO G4 before the turn off timing of the GTO G1, or by setting the turn off timing of the GTOs G1 and G4 to be simultaneous.

Figure 3:
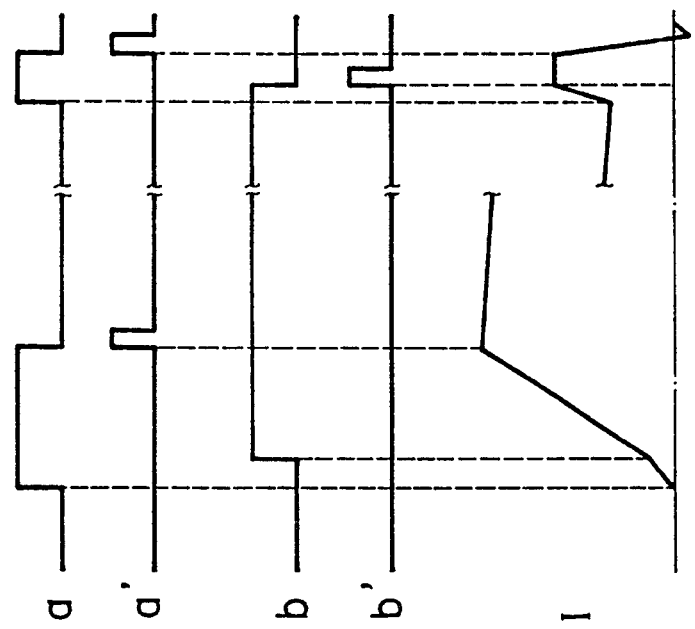
FIG. 3 is a timing chart for a testing procedure to simulate the PWM controlling pattern, to be realized by the operation of the apparatus of FIG. 1.

It is also to be noted that the testing of the self-commutative inverter 10 with the simulation of the PWM controlling pattern to be used in the self-commutative inverter 10 can be made by operating the testing apparatus of FIG. 1 according to the timing chart of FIG. 3.

Namely, by using the turn on pulse signals (a) and (b) and the turn off pulse signals (a') and (b') at mutually displaced timings as shown in FIG. 3, it becomes possible to check what happens in the self-commutative inverter 10 when the GTO in one phase is turned on or turned off while the other GTO in the other phase is turned on or turned off, with a very good reproducibility, and consequently it becomes possible to verify the operation of the self-commutative inverter 10 under the PWM controlling.

As described, in the testing procedure of the present invention, the testing of the operation of the self-commutative electric power conversion device is achieved by using the very short current conductions controlled by the pulse shaped turn on and turn off signals, so that the damaging of the self-commutative electric power conversion device due to the heat caused by the current conductions can be prevented, and it becomes possible to verify the proper operation of the self-commutative electric power conversion device under the maximum voltage stress and the maximum current stress, by using the settings off the voltage and the current which are beyond the verifiable limit of the conventional testing method.

In addition, in the testing procedure of the present invention the locations in the self-commutative electric power conversion device for making the measurements of the voltage and current waveforms are precisely known in advance, and the timings for making the measurements of the voltage and current waveforms are also precisely known because of the use of the pulse shaped signals, so that the testing can be carried out with a very good reproducibility. Consequently, the measurements of the voltage and current waveforms in the self-commutative electric power conversion device can be made with a very high reliability.

Moreover, in the testing procedure of the present invention, the power loss during the testing procedure is very small because of the use of the very short current conductions controlled by the pulse shaped signals, so that the capacities of the DC power source and the load required for the testing can be as small as approximately 1/100 to 1/1000 of those required in the conventional testing method, so that the testing of a very large capacity self-commutative electric power conversion device can be made without requiring the enormous cost and space for the testing facility.

As a consequence by using the method and the apparatus according to the present invention, it becomes possible to carry out the testing of a very large capacity self-commutative electric power conversion device, outside of the factory, which was practically impossible with the conventional testing method.

It is to be noted that the self-commutative inverter 10 used in the above description of the preferred embodiment is only an example of the self-commutative electric power conversion device, and the present invention is equally applicable to any self-commutative electric power conversion device in general.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of testing a self-commutative electric power conversion device including a DC capacitor and switching elements, comprising the steps of:
   supplying pulse shaped turn on and turn off signals to the switching elements in the self-commutative electric power conversion device, such that a load current having a desired current level for testing flows though an inductive load connected to an AC output side of the self-commutative electric power conversion device having the DC capacitor charged to a desired voltage level for testing; and
   measuring voltage and current waveforms in the self-commutative electric power conversion device, while the pulse shaped turn on and turn off signals are supplied to the switching elements by the supplying step, to verify an operation of the self-commutative electric power conversion device under voltage stress and current stress.

2. The method of claim 1, further comprising the step of charging the DC capacitor of the self-commutative electric power conversion device to the desired voltage level for testing by using a DC power charger, before the supplying step.

3. The method of claim 1, wherein the supplying step and the measuring step are repeated with the desired current level for testing and the desired voltage level for testing gradually increased.

4. The method of claim 1, wherein at the supplying step, the desired current level for testing and the desired voltage level for testing are maximum current and maximum voltage obtainable within a cooperative device protection limit of the self-commutative electric power conversion device, such that at the measuring step the operation of the self-commutative electric power conversion device is verified under maximum voltage stress and maximum current stress.

5. The method of claim 1, wherein at the measuring step, the voltage and current waveforms in the self-commutative electric power conversion device are measured at turn on and turn off timings of the switching elements in the self-commutative electric power conversion device.

6. The method of claim 1, wherein at the supplying step, the pulse shaped turn on and turn off signals are supplied to the switching elements in the self-commutative electric power conversion device at such timings for which turn on and turn off timings of the switching elements simulate an operation of the self-commutative electric power conversion device under PWM controlling.

7. An apparatus for testing a self-commutative electric power conversion device including a DC capacitor and switching elements, comprising:
   pulse signal generator means for supplying pulse shaped turn on and turn off signals to the switching elements in the self-commutative electric power conversion device, such that a load current having a desired current level for testing flows though an inductive load connected to an AC output side of the self-commutative electric power conversion device having the DC capacitor charged to a desired voltage level for testing; and
   measurement means for measuring voltage and current waveforms in the self-commutative electric power conversion device, while the pulse shaped turn on and turn off signals are supplied to the switching elements by the pulse signal generator means, to verify an operation of the self-commutative electric power conversion device under voltage stress and current stress.

8. The apparatus of claim 7, further comprising a DC power charger for charging the DC capacitor of the self-commutative electric power conversion device to the desired voltage level for testing, before the pulse signal generator means supplies the pulse shaped turn on and turn off signals to the switching elements.

9. The apparatus of claim 7, wherein the desired current level for testing and the desired voltage level for testing are maximum current and maximum voltage obtainable within a cooperative device protection limit of the self-commutative electric power conversion device, such that at the measurement means verifies the operation of the self-commutative electric power conversion device under maximum voltage stress and maximum current stress.

* * * * *